(12) United States Patent
Chang et al.

(10) Patent No.: US 8,395,453 B2
(45) Date of Patent: *Mar. 12, 2013

(54) ERROR COMPENSATION METHOD, DIGITAL PHASE ERROR CANCELLATION MODULE, AND ADPLL THEREOF

(75) Inventors: Hsiang-Hui Chang, Tapei Hsien (TW); Bing-Yu Hsieh, Taipei (TW); Jing-Hong Conan Zhan, HsinChu (TW)

(73) Assignee: Mediatek Inc., Science-Based Industrial Park, Hsin-Chu (TW)

( * ) Notice: Subject to any disclaimer, the term of this patent is extended or adjusted under 35 U.S.C. 154(b) by 953 days.

This patent is subject to a terminal disclaimer.

(21) Appl. No.: 12/235,623

(22) Filed: Sep. 23, 2008

(65) Prior Publication Data

US 2009/0097609 A1    Apr. 16, 2009

Related U.S. Application Data

(60) Provisional application No. 60/980,172, filed on Oct. 16, 2007, provisional application No. 60/980,461, filed on Oct. 17, 2007.

(51) Int. Cl.
*H03L 7/08* (2006.01)
*H03C 3/06* (2006.01)

(52) U.S. Cl. ........... 331/1 A; 331/17; 327/150; 327/159; 375/376

(58) Field of Classification Search .................. 331/1 A, 331/16, 17, 25; 327/147, 150, 156, 159; 332/123, 127, 128; 375/373, 375, 376
See application file for complete search history.

(56) References Cited

U.S. PATENT DOCUMENTS

| | | | |
|---|---|---|---|
| 4,942,374 A | 7/1990 | Sai | |
| 5,576,664 A | 11/1996 | Herold | |
| 5,834,987 A | 11/1998 | Dent | |
| 5,983,077 A | 11/1999 | Dent | |
| 6,326,851 B1 | 12/2001 | Staszewski | |
| 6,570,454 B2 | 5/2003 | Skierszkan | |
| 7,042,972 B2 | 5/2006 | Fahim | |
| 7,046,098 B2 | 5/2006 | Staszewski | |
| 7,145,399 B2 | 12/2006 | Staszewski | |
| 7,183,860 B2 | 2/2007 | Staszewski | |
| 7,203,262 B2 * | 4/2007 | Moy et al. ...................... | 375/376 |
| 7,365,607 B2 * | 4/2008 | Fahim ........................... | 331/1 A |
| 7,365,609 B2 * | 4/2008 | Waheed et al. ................. | 331/17 |
| 7,420,433 B2 | 9/2008 | O'Sullivan | |

(Continued)

FOREIGN PATENT DOCUMENTS

| | | |
|---|---|---|
| TW | 546921 | 8/2003 |
| TW | 200428782 | 12/2004 |

OTHER PUBLICATIONS

Robert Bogdan et al., IEEE Journal of Solid-State Circuits, vol. 39, No. 12, Dec. 2004.

(Continued)

*Primary Examiner* — Levi Gannon
(74) *Attorney, Agent, or Firm* — Winston Hsu; Scott Margo

(57) ABSTRACT

Phase error of a time-to-digital converter (TDC) within an all-digital phase-locked loop (ADPLL) is compensated by predicting possible phase error, which are predicted according to an estimated quantization error, a period of a digital-controlled oscillator (DCO), a gain of the TDC or a combination thereof. By appropriate inductions, the possible phase error may be further indicated by the quantization error, a code variance corresponding to a half of a reference period received by a TDC module having the TDC, a dividing ratio of a frequency divider of the ADPLL, a fractional number related to the quantization error or a combination thereof. A digital phase error cancellation module is also used for generating the possible phase error for compensating the phase error of the TDC.

23 Claims, 13 Drawing Sheets

U.S. PATENT DOCUMENTS

| | | | |
|---|---|---|---|
| 7,495,516 B2 | 2/2009 | Travis | |
| 7,573,348 B2 | 8/2009 | Bauernfeind | |
| 7,583,152 B2 | 9/2009 | Zhang | |
| 7,728,686 B2 | 6/2010 | Zhan | |
| 7,777,576 B2 * | 8/2010 | Waheed et al. | 331/17 |
| 7,791,428 B2 * | 9/2010 | Chang et al. | 332/123 |
| 8,031,007 B2 * | 10/2011 | Chang et al. | 331/1 A |
| 8,193,866 B2 * | 6/2012 | Chang | 331/1 A |
| 2003/0141936 A1 | 7/2003 | Staszewski | |
| 2003/0234693 A1 | 12/2003 | Staszewski | |
| 2006/0038710 A1 | 2/2006 | Staszewski | |
| 2006/0267640 A1 | 11/2006 | Travis | |
| 2007/0085579 A1 | 4/2007 | Wallberg | |
| 2007/0085623 A1 | 4/2007 | Staszewski | |
| 2007/0096836 A1 | 5/2007 | Lee | |
| 2007/0109067 A1 | 5/2007 | O'Sullivan | |
| 2007/0188244 A1 | 8/2007 | Waheed | |
| 2007/0205931 A1 | 9/2007 | Vanselow | |
| 2007/0273569 A1 | 11/2007 | Lin | |
| 2008/0315960 A1 | 12/2008 | Waheed | |
| 2008/0317169 A1 | 12/2008 | Boos | |
| 2008/0317188 A1 | 12/2008 | Staszewski | |
| 2009/0096535 A1 | 4/2009 | Chang | |
| 2009/0096539 A1 | 4/2009 | Chang | |
| 2010/0277244 A1 | 11/2010 | Chang | |

OTHER PUBLICATIONS

Robert Bogdan et al., IEEE Journal of Solid-State Circuits, vol. 40, No. 12, Dec. 2005.

Hsiang-Hui Chang et al., Title of Invention: Error Protection Method, TDC module, CTDC Module, All-Digital Phase-Locked Loop, and Calibration Method thereof, U.S. Appl. No. 12/982,918, filed Dec. 31, 2010.

P. K. Hanumolu, G.-Y. Wei, U.-K. Moon, and K. Mayaram, "Digitally-Enhanced Phase-Locking Circuits", IEEE 2007 Custom Intergrated Circuits Conf.(CICC), Sep. 2007, pp. 361-368.

R. B. Staszewski and P. T. Balsara, "All-Digital PLL With Ultra Fast Settling", IEEE Trans. on Circuits and Systems II, Express Briefs, Feb. 2007, pp. 181-185, vol. 54, No. 2.

* cited by examiner

ERROR COMPENSATION METHOD, DIGITAL PHASE ERROR CANCELLATION MODULE, AND ADPLL THEREOF

CROSS REFERENCE TO RELATED APPLICATIONS

This application claims the priority of U.S. Provisional Applications No. 60/980,172, filed on Oct. 16, 2007 and 60/980,461, filed on Oct. 17, 2007, which is included herein by reference.

Background of the Invention

1. Field of the Invention

The present invention relates to an error compensation method, a digital phase error cancellation, and an ADPLL (All-digital phase-locked loop) thereof, and more particularly, to an error compensation method for, a digital phase error cancellation module, and an ADPLL having the digital phase error cancellation module.

2. Description of the Prior Art

A phase-locked loop (PLL) is an electronic control system that generates a signal that has a fixed relation to the phase of a reference signal. A phase-locked loop circuit responds to both the frequency and the phase of the input signals, and automatically raises or lowers the frequency of a controlled oscillator until it is matched to the reference signal in both frequency and phase. A conventional analog PLL includes a phase detector, a voltage-controlled oscillator (VCO), and a feedback path for feeding output signals of the VCO back to an input terminal of the phase detector so as to raise or lower a frequency of input signals of the analog PLL. Therefore, the frequency of the analog PLL may always catch up with a reference frequency of a reference signal applied by the phase detector, i.e., the frequency of the input signals of the analog PLL is always locked by the reference frequency of the reference signal. Moreover, a frequency divider is conventionally applied on the feedback path so that multiples of the reference frequency may always be retrieved. A low-pass filter is conventionally connected after the phase detector so that noises staying at higher frequencies may thus be filtered.

As known by those skilled in the art, the analog PLL easily has errors (or even error propagation) since said analog PLL uses analog operations and analog elements. Therefore, digital phase-locked loops (DPLL), which utilize a counter with a variable divider on the feedback path, are proposed for relieving the errors with the partial aid of digital operations and digital elements, and moreover, an all-digital phase-locked loop (ADPLL) may significantly helps in area reduction and process migration. For example, a digital-controlled oscillator (DCO) may be used for in replace of the conventionally used VCO, which is an analog element. A phase detector may also be replaced with a time-to-digital converter. Therefore, the usage of the ADPLL is becoming a trend in radio communications.

SUMMARY OF THE INVENTION

The claimed invention discloses an error compensation method for an ADPLL (All-digital phase-locked loop). The error compensation method comprises determining a compensation error; and adding the determined compensation error to compensate an error within the ADPLL.

The claimed invention also discloses an error compensation method for an ADPLL (All-digital phase-locked loop). The error compensation method comprises determining a quantization error; determining a gain of a time-to-digital converter (TDC); determining a period of a digital-controlled oscillator (DCO); determining a compensation error according to the quantization error, the gain of the TDC, the period of the DCO or a combination thereof; and utilizing a sum of the determined compensation error and an output of a TDC module comprising the TDC when compensating for an error within the ADPLL.

The claimed invention further discloses a digital phase error cancellation module for compensating an error of an ADPLL (All-digital phase-locked loop). The digital phase error compensation module comprises a sigma-delta modulator (SDM); a first adder having a positive input terminal coupled to an input terminal of the SDM and having a negative input terminal coupled to an output terminal of the SDM; a second adder having a positive terminal coupled to an output terminal of the first adder; and a first D flip-flop having an input terminal coupled to an output terminal of the second adder and having an output terminal coupled to a negative input terminal of the second adder. The digital phase error cancellation module is disposed inside the ADPLL.

The claimed invention discloses an ADPLL (All-digital phase-locked loop) with error compensation. The ADPLL comprises a digital macro module. The digital macro module comprises a sigma-delta modulator (SDM) compensation module. The sigma-delta modulator compensation module comprises a digital phase error cancellation module. The digital phase error cancellation module comprises a sigma-delta modulator (SDM), a first adder, a second adder, and a first D flip-flop. The first adder has a positive input terminal coupled to an input terminal of the SDM, and has a negative input terminal coupled to an output terminal of the SDM. The second adder has a positive terminal coupled to an output terminal of the first adder. The first D flip-flop has an input terminal coupled to an output terminal of the second adder, and has an output terminal coupled to a negative input terminal of the second adder.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
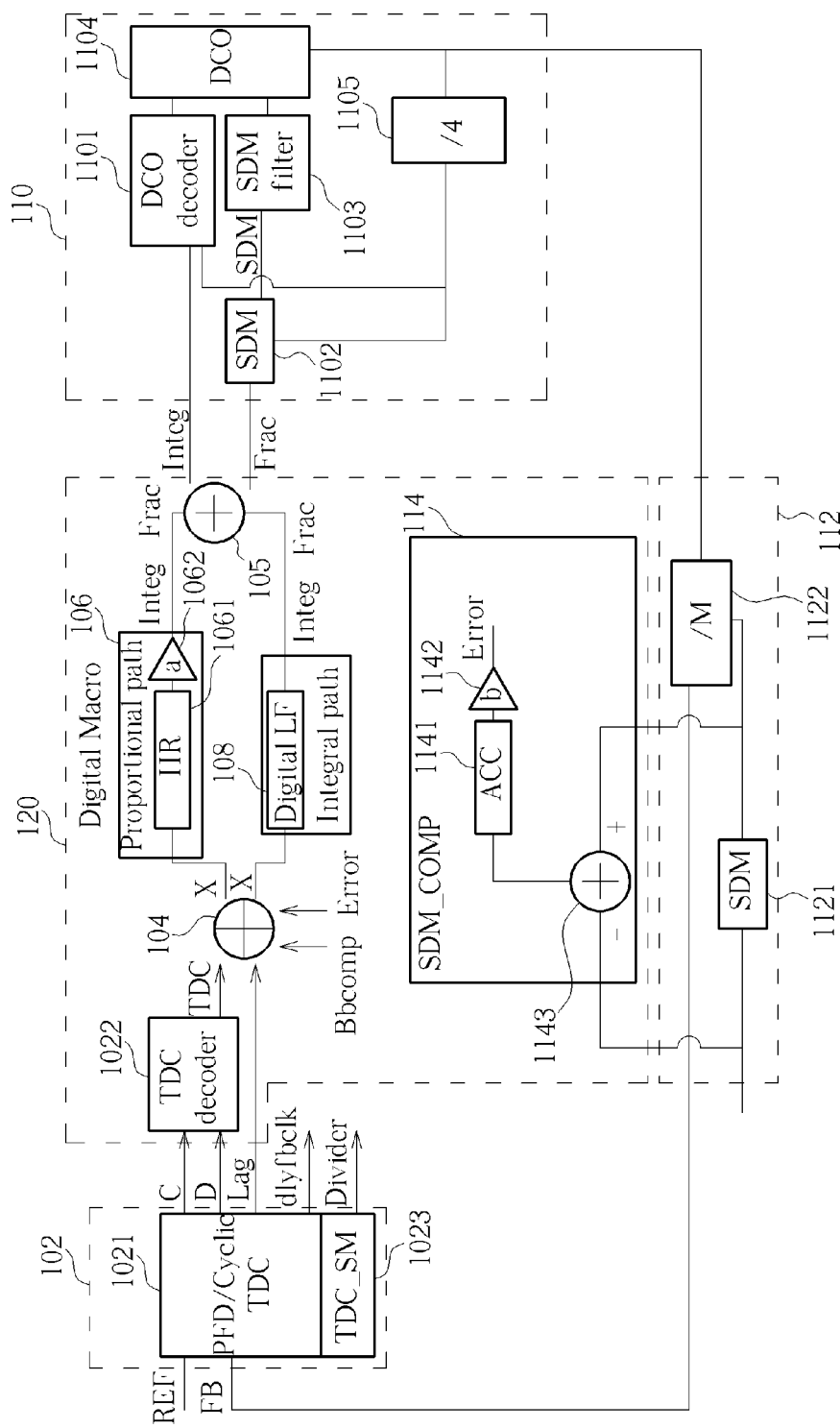
FIG. 1 is a diagram of an ADPLL disclosed in the present invention.

Please refer to FIG. 1, which is a diagram of an ADPLL 100 disclosed in the present invention. As shown in FIG. 1, ADPLL 100 includes a time-to-digital converter (TDC) module 102, a digital macro module 120, a digital-controlled oscillator (DCO)/sigma-delta modulator (SDM) module 110, and a feedback path module 112. The TDC module 102 includes a phase-frequency detector/cyclic time-to-digital converter (PFD/CTDC) module 1021 and a TDC state machine (TDC_SM) 1023. Though a cyclic TDC is employed in the embodiments hereinafter, any type of TDC may be applied to the invention. The digital macro module 120 includes a TDC decoder 1022, a first adder 104, a proportional path module 106, a digital low-pass filter (digital LF) 108, a second adder 105, and a SDM compensation module 114. The proportional path module 106 includes an infinite impulse response (IIR) module 1061 and a PPM amplifier 1062. Note that a gain of the PPM amplifier 1062 is $a$. The digital low-pass filter 108 serves as an integral path in the ADPLL 100. The SDM compensation module 114 includes a first accumulator 1141, a SDMCM amplifier 1142 with a gain $b$, and a third adder 1143. Note that the SDM compensation module 114 may also be referred as an error compensation module. The DCO/SDM module 110 includes a DCO decoder 1101, a first SDM 1102, a SDM filter 1103, a DCO 1104, and a first frequency divider 1105. Note that though a divider of the first frequency divider 1105 used and shown in FIG. 1 is 4, a value of the used divider may be other values other than 4 and be used in other embodiments of the present invention. The feedback path module 112 includes a second SDM 1121 and a second frequency divider 1112. Note that a divider used in the frequency divider 1112 is M, which is a variable.

As shown in FIG. 1, the TDC module 102 receives a reference signal REF and a feedback signal FB, and generate a cycle signals C and a data signal D, both of which carry phase information and frequency information related to the feedback signal FB. Note that the cycle signal C indicates a currently-used cycle of a cyclic time-to-digital converter (CTDC) within the PFD/CTDC module 102. Note that the data signal D indicates data generated by D flip-flops within the PFD/CTDC module 102. Note that the cycle signal C and the data signal D are then decoded by the TDC decoder 1022 so as to generate an output signal TDC within the digital macro module 120, where the output signal TDC also carries phase information and frequency information related to the feedback signal FB. The first adder 104 adds the output signal TDC with the error signal Error, which is in fact an error compensation signal, for canceling the possible error within the output signal TDC to a certain degree, and outputs a signal X to both the proportional path module 106 and the digital LF 108. Note that a self-test signal Bbcomp and a sign signal Lag, which is generated from the PFD/CTDC module 1021, are also added for carrying information about whether to raise or lower a frequency of an output signal of the DCO/SDM module 110. Also note that the PFD/CTDC module 1021 outputs a clock signal dlyfbclk to manipulate a built-in clock of the digital macro module 120. The TDC state machine 1023 also generates a divider signal Divider to carry divider-related information to the digital macro module 120.

The proportional path module 106 is responsible for tracking variations of the phase of the signal X, whereas the digital low-pass filter 108, i.e. the integration path, is responsible for tracking long-term frequency drifts of said signal X. The digital macro module 106 outputs an integer signal Integ and a fractional signal Frac to the DCO/SDM module 110.

In the DCO/SDM module 110, the DCO decoder 1101 has a first input terminal for receiving the integer signal; the first SDM 1102 has a first input terminal for receiving the fractional signal; the SDM filter 1103 has an input terminal coupled to an output terminal of the first SDM 1102; the DCO 1104 has a first input terminal coupled to an output terminal of the DCO decoder 1101, and a second input terminal coupled to an output terminal of the SDM filter 1103; and the first frequency divider 1105 has an input terminal coupled to an output terminal of the DCO 1104, and an output terminal coupled to both a second input terminal of the DCO decoder 1101 and a second input terminal of the first SDM 1102. Note that a first loop passing though the DCO decoder 1101, the DCO 1104, and the first frequency divider 1105 is responsible for modulating the integer signal Integ, whereas a second loop passing through the first SDM 1102, the SDM filter 1103, the DCO 1104, and the frequency divider 1105 is responsible for modulating the fractional signal Frac.

The feedback path nodule 112 cooperates with the SDM compensation module 114, which is included in the digital macro module 120. The second divider 1122 is used for dividing the frequency of a signal outputted from the DCO/SDM module 110, and cooperates with the second SDM 1121. The SDM compensation module 114 is utilized for predicting possible errors of the signal outputted from the DCO/SDM module 110 and inputting the predicted errors, which are carried in the error compensation signal, into the first adder 104 in a feed-forward manner so that errors from the signal TDC are significantly reduced. Note that the third adder 1143 has a positive input terminal coupled to an input terminal of the second SDM 1121, a negative input terminal coupled to an output terminal of the second SDM 1121, and an output terminal coupled to an input terminal of the first accumulator 1141.

Characteristics of a structure of the ADPLL 100 primarily lie in the existences of the proportional path module 106, the digital low-pass filter 108, and the SDM compensation module 114 since the listed elements are highly related to fine calibration of a loop gain of the ADPLL 100. However, all the included elements, modules, and signals are digital so that the ADPLL 100 is entirely controlled digitally, and as a result, an accurate bandwidth control is achieved with the aid of the all-digital control mechanism. The ADPLL 100 also works in reducing switching noises, though detailed techniques will be explained later.

Figure 2:
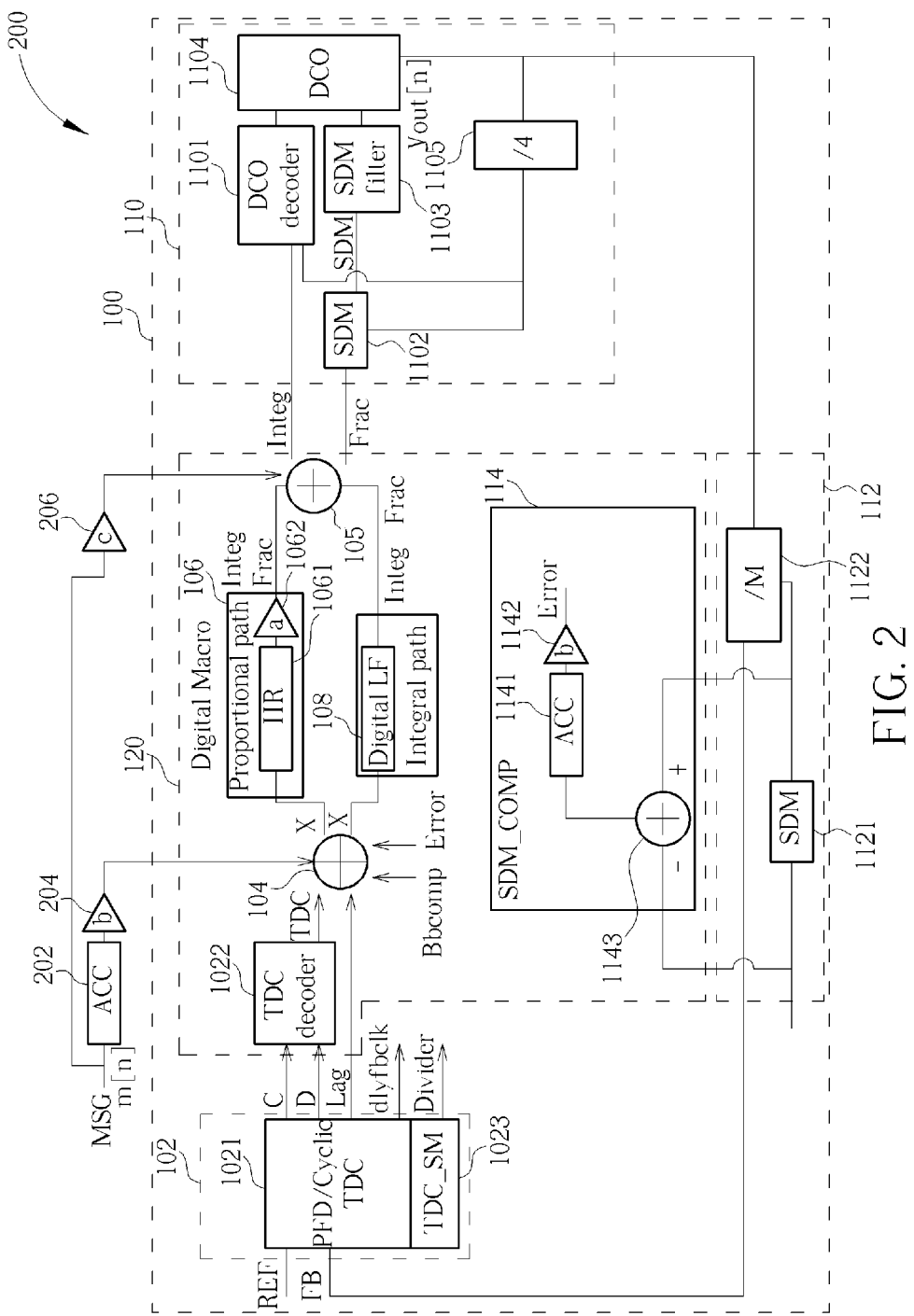
FIG. 2 is a diagram of a DFM ADPLL based on the ADPLL disclosed in FIG. 1 of the present invention.

A primary usage of the ADPLL 100 is to implementing an all-digital architecture of direct-frequency modulation (DFM). Please refer to FIG. 2, which is a diagram of a DFM ADPLL 200 based on the ADPLL 100 disclosed in FIG. 1 of the present invention. As shown in FIG. 2, besides the ADPLL 100, a second accumulator 202, a ACC amplifier 204, which cooperates with the second accumulator 202 and uses a same gain b as the SDMCM amplifier 1142, and a MOD amplifier 206, which uses a gain c. A message MSG, which is in fact a modulation signal, is inputted to the second accumulator 202 and the MOD amplifier 206 so as to be fed into both the first adder 104 and the second adder 105 in a feed-forward manner. Note that a combination of the second accumulator 202 and the ACC amplifier 204 acts a low pass filter for the message MSG. Also note that the MOD amplifier 206 gives a high pass response to the message MSG, where a VCO in a conventional PLL gives an upper bound of the frequency domain of the message MSG, i.e., the VCO acts as a low-pass filter so that the frequency domain of the message MSG is restricted by the low-pass filter. By combining the abovementioned high-pass and low-pass responses, an all-pass response may be retrieved so that wide band modulation or independence from a bandwidth of PLL is achieved. In manipulating the all-pass response, values of the gains b and c have to be well adjusted. Note that the purpose of wide-band modulation is achieved since a frequency domain of the message MSG is not restricted in or related to the DFM ADPLL 200 with the aid of the all-pass response. A pre-distortion technique used in the conventional PLL for distorting noises in advance is also avoided in the ADPLL 200 of the present invention, where elements for implementing the pre-distortion technique conventionally occupy large areas.

The technique in modulating values of the gains b and c is described as follows. Please refer to FIG. 2, and a loop gain of the DFM ADPLL 200 may be derived by using an input response m[n] in the message MSG to derive a corresponding output frequency response $V_{out}[n]$ as an output response at the DCO/SDM module 110. A loop gain of the DFM ADPLL 200 is indicated by $$\frac{V_{out}[n]}{m[n]},$$

a response of which is derived as follows:

$$\frac{V_{out}[n]}{m[n]} = \frac{c \cdot Kv + b \cdot L(z) \cdot Kv}{1 + \frac{1}{TDC \cdot Fref^2} \cdot L(z) \cdot Kv \cdot \frac{1}{M} \cdot \frac{Z^{-1}}{1 - Z^{-1}}} \quad (1)$$

$$= 1$$

while the DFM ADPLL 200 is to be modulated with an all-pass state. Some conditions used in the equation (1) are simply explained as follows. The term $c \cdot Kv$ indicates a response of a path including the MOD amplifier 206 and the DCO/SDM module 110, where Kv is a gain of the DCO/SDM module 110, i.e., a gain of the DCO 1104. The term $$b \cdot L(z) \cdot Kv \cdot \frac{Z^{-1}}{1 - Z^{-1}}$$

indicates a response of a path including a combination of the second accumulator 202 and the ACC amplifier 204, the digital low-pass filter 108, and the DCO/SDM module 110, where a response of the digital low-pass filter 108 is L(z). The term $$\frac{1}{TDC \cdot Fref^2}$$

is a gain of the TDC module 102, where Fref is a reference frequency of the reference signal REF, and TDC indicates a gain of a Cyclic TDC within the PFD/CTDC module 1021.

$$\frac{1}{M}$$

is a response of the second frequency divider 1112.

$$\frac{Z^{-1}}{1 - Z^{-1}}$$

indicates a frequency response of the DCO 1104 and the ACC amplifier 204.

As can be observed from the equation (1), for satisfying the all-pass state, the values of both the gains b and c are derived by the following equations:

$$c \cdot Kv = 1 \quad (2)$$

$$b \cdot L(z) \cdot Kv = \frac{1}{TDC \cdot Fref^2} \cdot L(z) \cdot Kv \cdot \frac{1}{M} \cdot \frac{Z^{-1}}{1 - Z^{-1}} \quad (3)$$

By inductions, the values of both the gains b and c may be indicated as follows:

$$c = \frac{1}{Kv} \quad (4)$$

$$b = \frac{1}{TDC \cdot Fref^2} \cdot \frac{1}{M} \quad (5)$$

For achieving the aim of the all-digital controlling mechanism, complete manipulations of values of both the gains b and c are necessary. To manipulate the gain b, the value of the TDC gain TDC has to be controllable as well. A definition of the TDC gain TDC is defined as a resolution of the TDC module 102, i.e., a time variance $\Delta t$ over a code variance $\Delta N$, so that the TDC gain TDC is derived as follows:

$$TDC = \frac{\Delta t}{\Delta N} = \frac{\frac{1}{2} Tref}{N_1} = \frac{1}{2 Fref \cdot N_1} \quad (6)$$

Note that the code variance $N_1$ corresponds to a half of a reference period Tref of the reference signal, in which a positive state and a negative state occupy one half of the reference period Tref in turn. With the equation (6), the value of the gain b may be rewritten as follows:

$$b = \frac{1}{\frac{1}{2 \cdot Fref \cdot N_1} \cdot Fref^2} \cdot \frac{1}{M} = \frac{2N_1}{M} \cdot \frac{1}{Fref} \quad (7)$$

To manipulate the value of the gain c, the DCO gain Kv is required to be controllable. The DCO gain Kv may be used for deriving the gain c as follows:

$$c = \frac{1}{Kv} = \frac{\Delta I}{\Delta N \cdot Fref} \qquad (8)$$

The term $\Delta N \cdot Fref$ indicates a frequency variance in a signal at the input terminal of the second SDM 1121, and a code variance $\Delta I$ corresponding to the frequency variance $\Delta N \cdot Fref$ is retrieved in the output signal of the digital low-pass filter 108, where $\Delta N$ indicates a fractional code variance. Since the terms $\Delta N \cdot Fref$ and $\Delta I$ are controllable, the value of the gain c should also be controllable as well. Fine and delicate modulation of the loop gain of the DFM ADPLL 200 is thus complete.

The DCO 1104 is utilized for tracking a frequency band of an output signal of the digital macro module 120 according to both an integer signal and a fractional signal within the output signal. The integer signal is decoded by the DCO decoder 1101, and the fractional signal is retrieved with the aid of both the SDM 1102 and the SDM filter 1103. Operations of both the SDM 1102 and the SDM filter 1103 are similar with a conventional SDM and SDM filter so that the operations are not further described. Use of a conventional DCO within embodiments is also intended to be within the scope of the current disclosure, however the DCO 1104 preferably is specifically designed and proposed in the present invention for the frequency band tracking and avoiding a significant frequency discontinuity. Please refer to FIG. 3, which is a detailed diagram of the DCO 1104 illustrated in FIG. 1 and FIG. 2 and proposed in the present invention. The DCO 1104 includes an on-chip low-drop-out (LDO) regulator 302, which could be excluded from the DCO if the targeted application permits, an inductor/resistor module 304 coupled to the LDO regulator 302, a process/voltage/temperature (PVT) tank 306 coupled to the inductor/resistor set 304, an acquisition tank (ACQ) 308 coupled to the PVT tank 306, and a tracking tank (TRK) 310 coupled to the acquisition tank 308. Elements other than the tracking tank 310 may be implemented conventionally so that the elements are merely and simply described as follows. The on-chip LDO regulator 302 generates a required voltage VCCreg for the DCO 1104 according to a voltage VCC. The inductor/resistor set 304 includes inductors, switchable resistors, and a negative gm cell 3042, for setting current consumption and oscillation amplitudes of the DCO 1104, for improving common-mode rejection, and for reducing noises and spurs generated from grounds of the DCO 1104. The PVT tank 306 is provided for compensating process/voltage/temperature variations. The acquisition tank 308 is provided for fast frequency acquisition.

Figure 3:
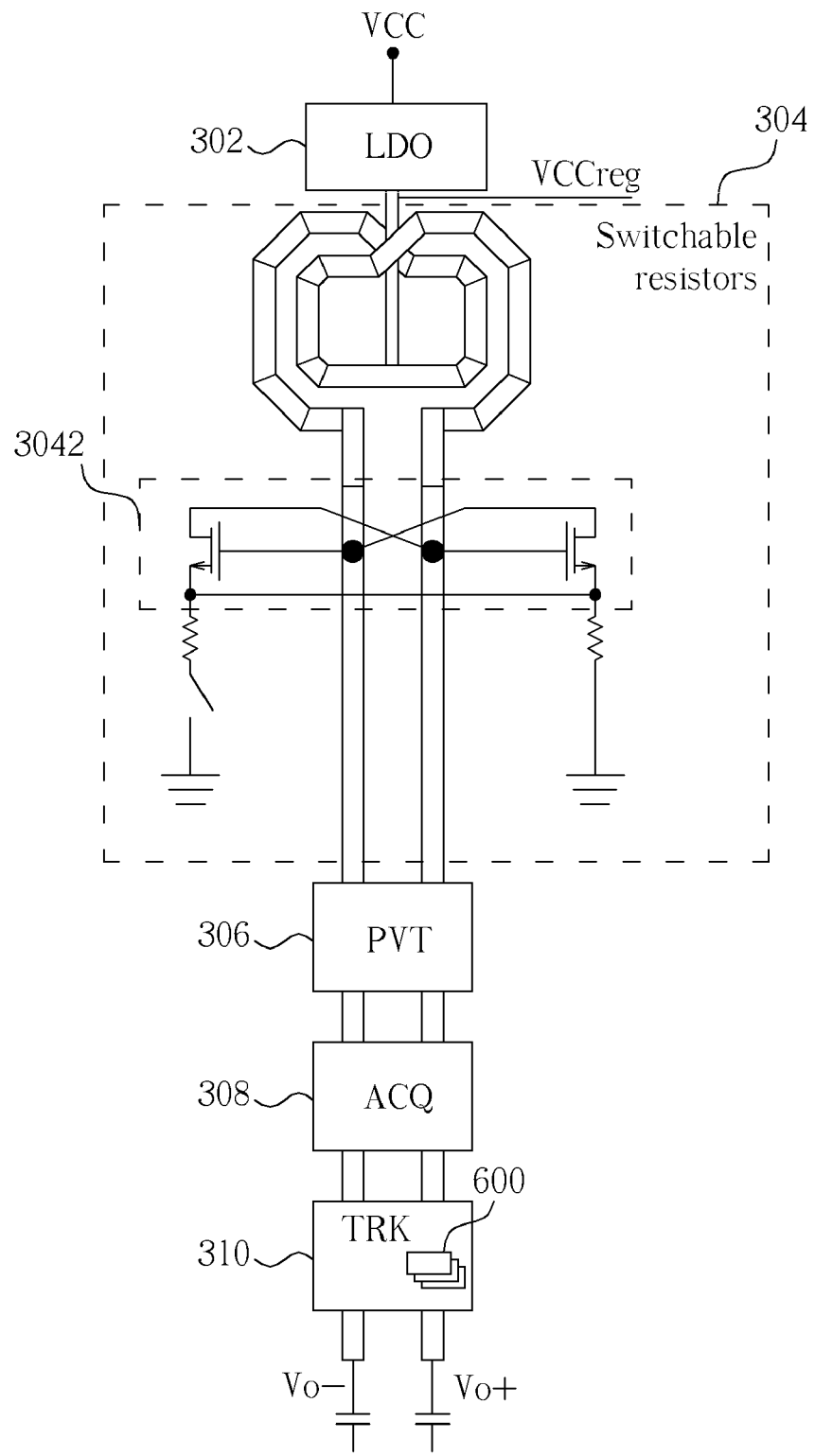
FIG. 3 is a detailed diagram of the DCO illustrated in FIG. 1 and FIG. 2 and proposed in the present invention.
Figure 4:
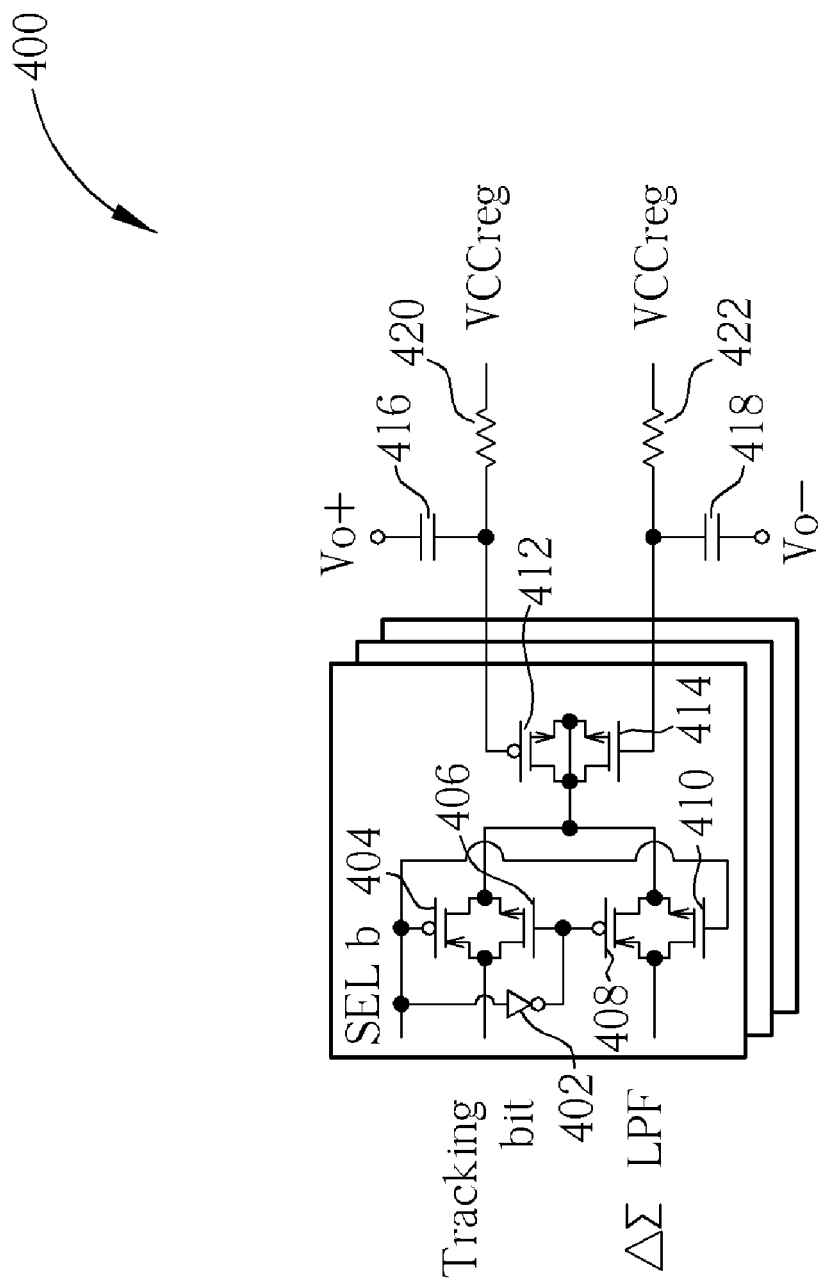
FIG. 4 is a diagram of a cell of a conventional tracking tank.
Figure 5:
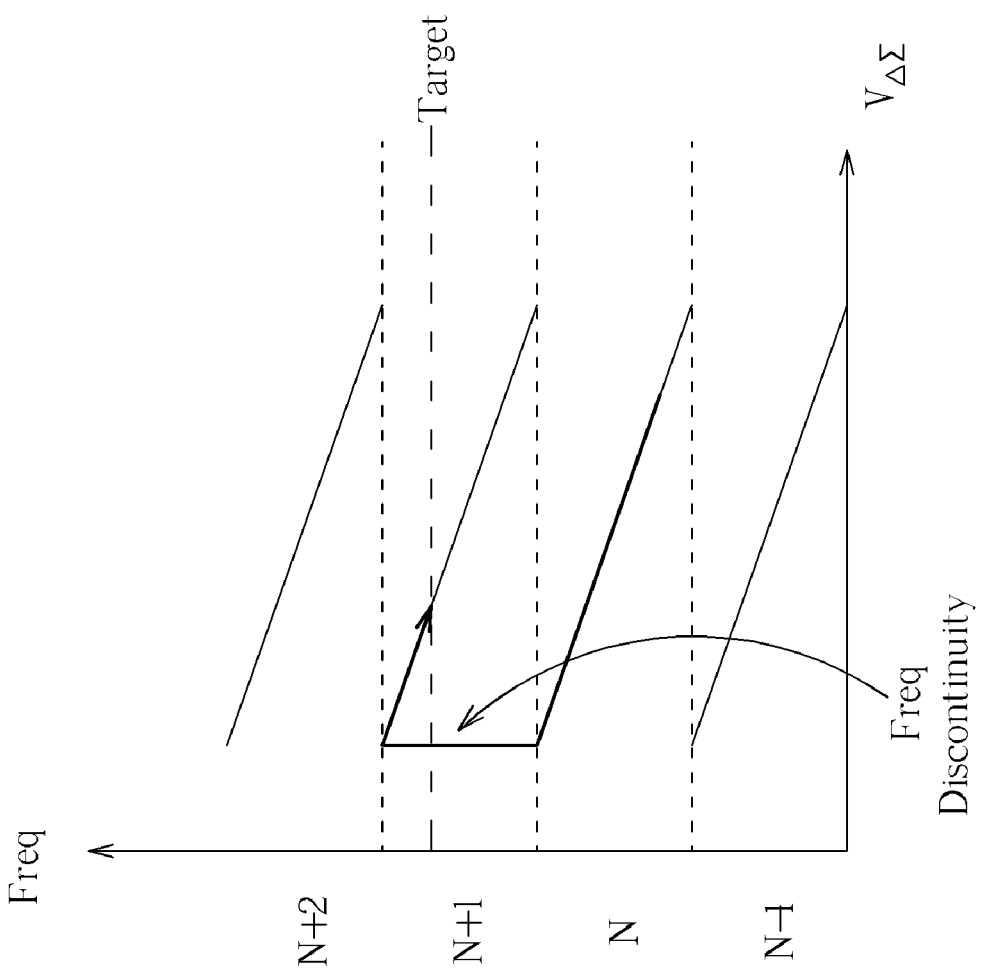
FIG. 5 is a plot of a voltage-frequency transfer curve related to the cell of the conventional tracking tank illustrated in FIG. 4.
Figure 6:
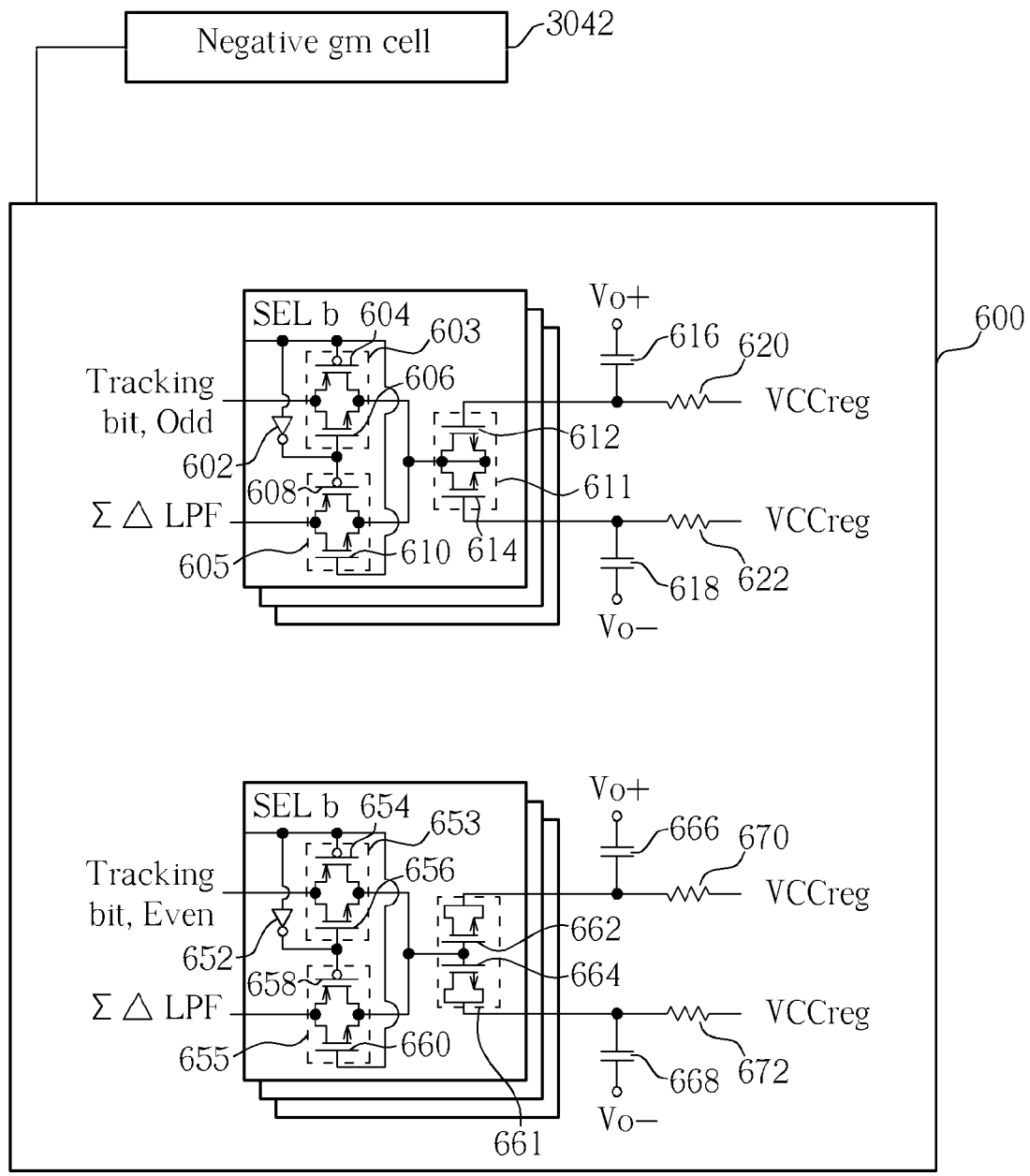
FIG. 6 is a detailed diagram of a cell of the tracking tank illustrated in FIG. 3.
Figure 7:
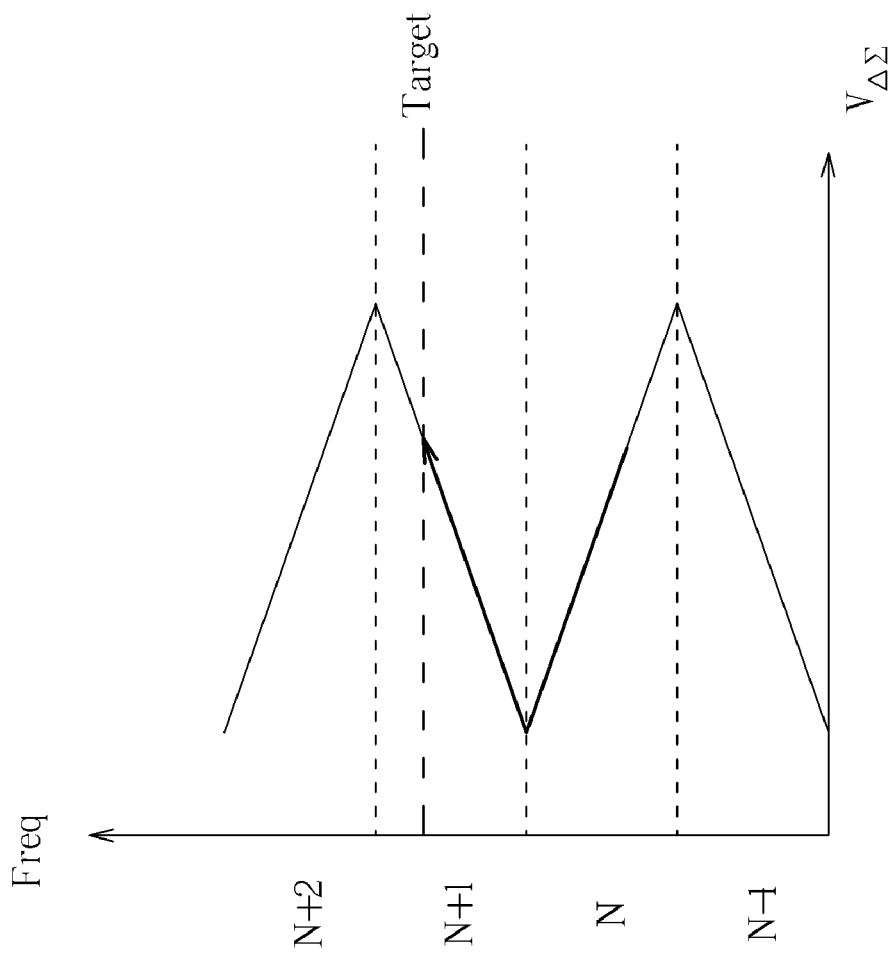
FIG. 7 is a plot of a folded voltage-frequency transfer curve related to the cell f the tracking tank illustrated in FIG. 6.

Primary characteristics of the DCO 1104 lie in the tracking tank 310. Before disclosing the tracking tank 310 in detail, a conventional tracking tank is introduced herein for explaining advantages of the tracking tank 310. Please refer to FIG. 4, FIG. 5, FIG. 6, and FIG. 7. FIG. 4 is a diagram of a cell 400 of a conventional tracking tank. FIG. 5 is a plot of a voltage-frequency transfer curve related to the cell 400 of the conventional tracking tank illustrated in FIG. 4. FIG. 6 is a detail diagram of a cell 600 of the tracking tank 310 illustrated in FIG. 3. FIG. 7 is a plot of a folded voltage-frequency transfer curve related to the cell 600 of the tracking tank 310 illustrated in FIG. 6.

As shown in FIG. 4, the cell 400 of the conventional tracking tank includes an inverter 402, a first P-type MOSFET 404, a first N-type MOSFET 406, a second P-type MOSFET 408, a second N-type MOSFET 410, a third N-type MOSFET 412, a fourth N-type MOSFET 414, a first capacitor 416, a second capacitor 418, a first resistor 420, and a second resistor 422. Couplings of the above-listed elements are shown on FIG. 4 so that the couplings are not described for brevity. The voltage VCCreg is inputted at both the resistors 420 and 422. A bit, which may be odd or even for indicating a digital integer signal from the DCO decoder 1101, is inputted to a set including the first P-type MOSFET 404 and the first N-type MOSFET 406. A SDM fractional signal, which may also be regarded as a primary voltage, from the SDM filter 1103 is inputted to a set including both the second P-type MOSFET 408 and the second N-type MOSFET 410. A pair including a high output voltage Vo+ and a low output voltage Vo− is outputted for indicating oscillations of the conventional tracking tank. In brief, every time when a related integer signal is incremented by 1, the SDM fractional signal is decremented by 1 so that an average of the SDM fractional signal stays below 1 (or near zero). However, since the inputted bit keeps on changing between 0 and 1, every time when the integer signal is incremented by 1 instantly, a speed of decrementing the SDM fractional signal cannot catch up with the increment of the integer signal. Therefore, as shown in FIG. 5, a frequency discontinuity happens while the integer value is incremented from N to (N+1) since the SDM fractional signal cannot be adjusted (or be accordingly decreased) to reach the Target, which is shown in FIG. 5, until the integer value (N+1) is reached.

The cell 600 of the tracking tank 310 is disclosed herein for solving such discontinuity. The cell 600 splits operations of the odd and even bits into two different sets, i.e., an odd set and an even set, so that the transfer curve shown in FIG. 7 is folded without a frequency jump, which indicates a procedure in reaching the Target after reaching the integer value (N+1).

As shown in FIG. 6, the cell 600 includes a first set for handling the odd bit and a second set for handling the even bit. Note that in other embodiments of the present invention, the first set may also be utilized for handling the even bit, whereas the second set is utilized for handling the odd bit. The first set includes a first inverter 602, a first digital module 603 for processing odd digital bits from the DCO decoder 1101, a first analog module 605 for processing SDM fractional signals from the SDM filter 1103, and a first capacitance module 611 for bringing required capacitance to output voltages Vo+ and Vo−. The first digital module 603 includes a first P-type MOSFET 604 and a first N-type MOSFET 606. The first analog module 605 includes a second P-type MOSFET 608 and a second N-type MOSFET 610. The first capacitance module 611 includes a third N-type MOSFET 612 and a fourth N-type MOSFET 614. The first set further includes a first capacitor 616, a second capacitor 618, a first resistor 620, and a second resistor 622. Note that components of the first digital module 603, the first analog module 605, and the first capacitance module 611 are not restricted by those shown in FIG. 6 in other embodiments of the present invention. The second set includes a second inverter 652, a second digital module 653 for processing even digital bits from the DCO decoder 1101, a second analog module 655 for processing SDM fractional signals from the SDM filter 1103, and a second capacitance module 661 for bringing required capacitance to output voltages Vo+ and Vo−. The second digital module 653 includes a third P-type MOSFET 654 and a fifth N-type MOSFET 656. The second analog module 655 includes a fourth P-type MOSFET 658 and a sixth N-type MOSFET 660. The second capacitance module 661 includes a seventh N-type MOSFET 662 and an eighth N-type MOSFET 664. The second set further includes a third capacitor 666, a fourth capacitor 668, a third resistor 670, and a fourth resistor 672.

The first inverter 602 has a positive terminal for receiving the selection signal SEL. The first P-type MOSFET 604 has a gate coupled to the positive terminal of the first inverter 602, and a source for receiving the odd bit. The first N-type MOSFET 606 has a drain coupled to the source of the first P-type MOSFET 604, and a source coupled to a drain of the first P-type MOSFET 604. The second P-type MOSFET 608 has a gate coupled to both a negative terminal of the first inverter 602 and a gate of the first N-type MOSFET 606. The second N-type MOSFET 610 has a drain coupled to a source of the second P-type MOSFET 608 for receiving signals from a sigma-delta low-pass filter, to a drain of the second P-type MOSFET 608, and to the source of the first N-type MOSFET 606, has a source coupled to a drain of the second P-type MOSFET 608, and has a gate coupled to the gate of the first P-type MOSFET 604. The third N-type MOSFET 612 has a source coupled to the source of the first N-type MOSFET 606, and a drain coupled to the source of the third N-type MOSFET 612. The fourth N-type MOSFET 614 has a drain coupled to the source of the third N-type MOSFET 612, and a source coupled to the drain of the third N-type MOSFET 612. The first capacitor 616 has a first terminal coupled to a gate of the third N-type MOSFET 612 and a second terminal for outputting a first high output voltage. The second capacitor 618 has a first terminal coupled to a gate of the fourth N-type MOSFET 614, and a second terminal for outputting a first low output voltage. The first resistor 620 has a first terminal coupled to the first terminal of the first capacitor 616, and a second terminal for receiving the generated required voltage from the LDO regulator. The second resistor 622 has a first terminal coupled to the first terminal of the second capacitor 618, and a second terminal for receiving the generated required voltage from the LDO regulator. The second tracking set comprises a second inverter 652, a third P-type MOSFET 654, a fifth N-type MOSFET 656, a fourth P-type MOSFET 658, a sixth N-type MOSFET 660, a seventh N-type MOSFET 662, an eighth N-type MOSFET 664, a third capacitor 666, a fourth capacitor 668, a third resistor 670, and a fourth resistor 672. The second inverter 652 has a positive terminal for receiving the selection signal. The third P-type MOSFET 654 has a gate coupled to the positive terminal of the second inverter 652, and a source for receiving the even bit. The fifth N-type MOSFET 656 has a drain coupled to the source of the P-type MOSFET, a source coupled to a drain of the third P-type MOSFET 654, and a gate coupled to a negative terminal of the second inverter 652. The fourth P-type MOSFET 658 has a gate coupled to the gate of the fifth N-type MOSFET 656, a source for receiving signals from a sigma-delta low-pass filter, and a drain coupled to the source of the fifth N-type MOSFET 656. The sixth N-type MOSFET 660 has a drain coupled to the source of the fourth P-type MOSFET 658, a source coupled to the drain of the fourth P-type MOSFET 658, and a gate coupled to the gate of the third P-type MOSFET 654. The seventh N-type MOSFET 662 has a gate coupled to the source of the fifth N-type MOSFET 656, a source, and a drain coupled to the source of the seventh N-type MOSFET 662. The eighth N-type MOSFET 664 has a gate coupled to the gate of the seventh N-type MOSFET 662, a source, and a drain coupled to the source of the eighth N-type MOSFET 664. The third capacitor 666 has a first terminal coupled to the drain of the seventh N-type MOSFET 662, and a second terminal for outputting a second high voltage. The fourth capacitor 668 has a first terminal coupled to the drain of the eighth N-type MOSFET 664, and a second terminal for outputting a second low voltage. The third resistor 670 has a first terminal coupled to the first terminal of the third capacitor 666, and a second terminal for receiving the generated required voltage of the LDO regulator. The fourth resistor 672 has a first terminal coupled to the first terminal of the fourth capacitor 668, and a second terminal for receiving the generated required voltage of the LDO regulator. Both the first high output voltage and the first low output voltage indicate oscillations in the odd bit of the tracking tank. Both the second high output voltage and the second low output voltage indicate oscillations in the even bit of the tracking tank.

The negative gm cell 3042 feeds control signals into each the cell 600 for bringing required positive feedback in stabilizing oscillations in the output voltages Vo+ and Vo−. With predetermined control signals at the nodes SEL and b shown in FIG. 6 and the inverter 602 (or the inverter 652), at one time, merely one among the first digital module 603 and the first analog module 605 (or merely one among the second digital module 653 and the second analog module 655) is switched on, i.e., control voltage parity is brought herein. Therefore, operations related to integer signals and fractional signals may be separated and independent for fulfilling the mechanism shown in FIG. 7. Note that compositions and components of the negative gm cell 3042 are not restricted as shown in FIG. 3.

Note that a capacitance generated from the first capacitance module 611 has to be opposite to a capacitance generated from the second capacitance module 661 respectively for the odd and even bits, and such an opposition lead to two mutually-inverse curves corresponding to output voltages Vo+ and Vo− of both the first tracking set and the second tracking set. As shown in FIG. 7, while the integer value is incremented by 1, the curve goes on a reverse path with respect to the curve shown in FIG. 5 so that the frequency discontinuity is eliminated. As a result, undesired spurs disappear as well, and a related phase is thus continuously locked.

Then turn to the subject of digital loop bandwidth calibration of the ADPLL 100 (or 200). For explaining digital loop bandwidth calibration of the ADPLL 100, a simplified diagram of the ADPLL 100 has to be illustrated in advance. Please refer to FIG. 8, which is a simplified diagram of the ADPLL 100 shown in FIG. 1 for explaining the digital loop bandwidth calibration of said ADPLL 100. Note that the ADPLL 100 may be regarded as a high-resolution frequency-to-digital converter (FDC) at this time. A key to implement the digital loop bandwidth calibration is to calibrate the value of the gain a since other related variables are controllable, where the point will be proved later. A definition of the loop bandwidth is a proportional path gain of the proportional path module 106 multiplied by $$\frac{Fref}{2\pi}.$$

Therefore, the proportional path gain Pgain may be represented as follows:

$$Pgain = \frac{BW \cdot 2\pi}{Fref} \quad (9)$$

where the term BW indicates the loop bandwidth of the ADPLL 100. By observing the simplified diagram shown in FIG. 8, the proportional path gain Pgain may also be represented as:

$$Pgain = \frac{1}{TDC} \cdot a \cdot DCO \cdot \frac{1}{M} \cdot \frac{1}{Fref^2} \qquad (10)$$

Figure 8:
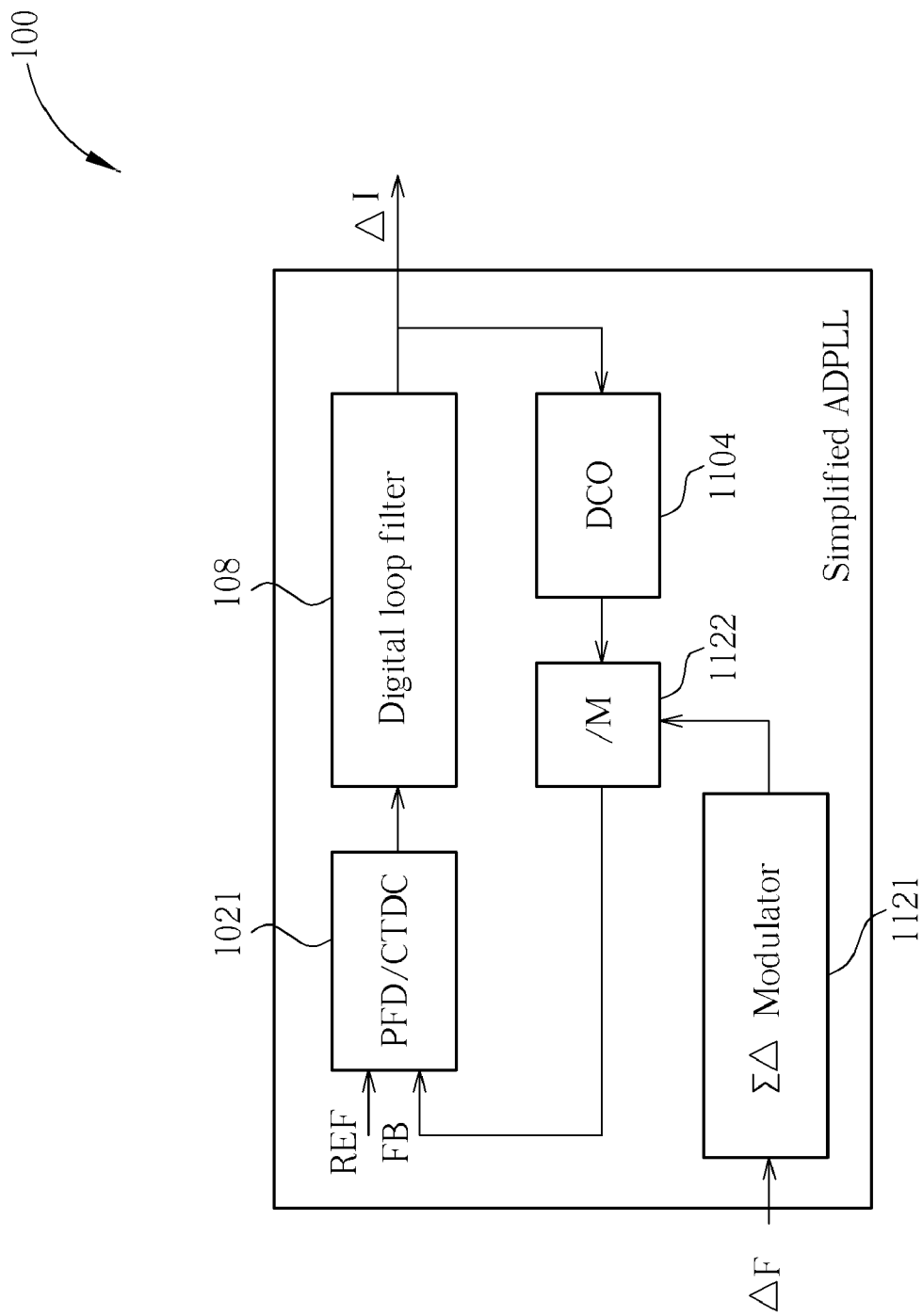
FIG. 8 is a simplified diagram of the ADPLL shown in FIG. 1 for explaining the digital loop bandwidth calibration of said ADPLL.

Definitions of variables in the equation (10) are the same with the abovementioned functions so that the definitions are not described repeatedly. The term $$\frac{1}{TDC}$$

indicates a variance of codes from the PFD/CTDC module 1021 in unit time. The gain a of the proportional path module (PPM) amplifier 106 is regarded as a gain of the digital low-pass filter 108 at this time. Note that the term $$\frac{1}{TDC} \cdot a$$

indicates a variance of codes at the output terminal of the digital low-pass filter 108, i.e., a code variance $\Delta I$ shown in FIG. 8. The term $$\frac{1}{TDC} \cdot a \cdot DCO$$

indicates a frequency variance $\Delta f_c$ resulted from the variance of codes, i.e., the code variance $\Delta I$. The term $$\frac{1}{TDC} \cdot a \cdot DCO \cdot \frac{1}{M}$$

indicates the frequency variance $\Delta f$ divided by the dividing ratio M of the second frequency divider 122. At last, note that the proportional path gain Pgain indicates a time drift $\Delta t_c$ resulted by a code variance with respect to a unit time. A reference period $$Tref = \frac{1}{Fref}$$

is also noted so that the following equation is satisfied:

$$\frac{\Delta t_c}{Tref} = \frac{\Delta f_c}{Fref} \qquad (11)$$

The time drift $\Delta t_c$ may be inducted as:

$$Pgain = \Delta t_c \qquad (12)$$

$$= \frac{\Delta f_c}{Fref} \cdot \frac{1}{Fref}$$

$$= \frac{\Delta f_c}{Fref^2}$$

$$= \frac{\Delta f}{M} \cdot \frac{1}{Fref^2}$$

$$= \frac{1}{TDC} \cdot a \cdot DCO \cdot \frac{1}{M} \cdot \frac{1}{Fref^2}$$

The equation (12) explains how the equation (10) is inducted. Note that the gain DCO may also be referred as the gain Kv. By combining the equation (9) and (10), and refer to both the equations (6) and (8), the gain a may be inducted with the follow equations:

$$\frac{1}{TDC} \cdot a \cdot Kv \cdot \frac{1}{M} \cdot \frac{1}{Fref^2} = Pgain = \frac{BW \cdot 2\pi}{Fref} \qquad (13)$$

and $$a = \frac{TDC \cdot M \cdot Fref^2 \cdot BW \cdot 2\pi}{Kv \cdot Fref} \qquad (14)$$

$$= \frac{TDC \cdot M \cdot Fref \cdot BW \cdot 2\pi}{Kv}$$

$$= \frac{1}{2Fref \cdot N_1} \cdot M \cdot Fref \cdot BW \cdot 2\pi \cdot \frac{\Delta I}{\Delta N \cdot Fref}$$

$$= \frac{\Delta I \cdot M \cdot BW \cdot 2\pi}{2N_1 \cdot Fref \cdot \Delta N}$$

Variables related to the gain a in the equation (14) have been proved above to be controllable so that the gain a is controllable as well. In other words, by adjusting the value of the gain a according to the equation (14), the loop bandwidth calibration of the ADPLL 100 is feasible.

Figure 9:
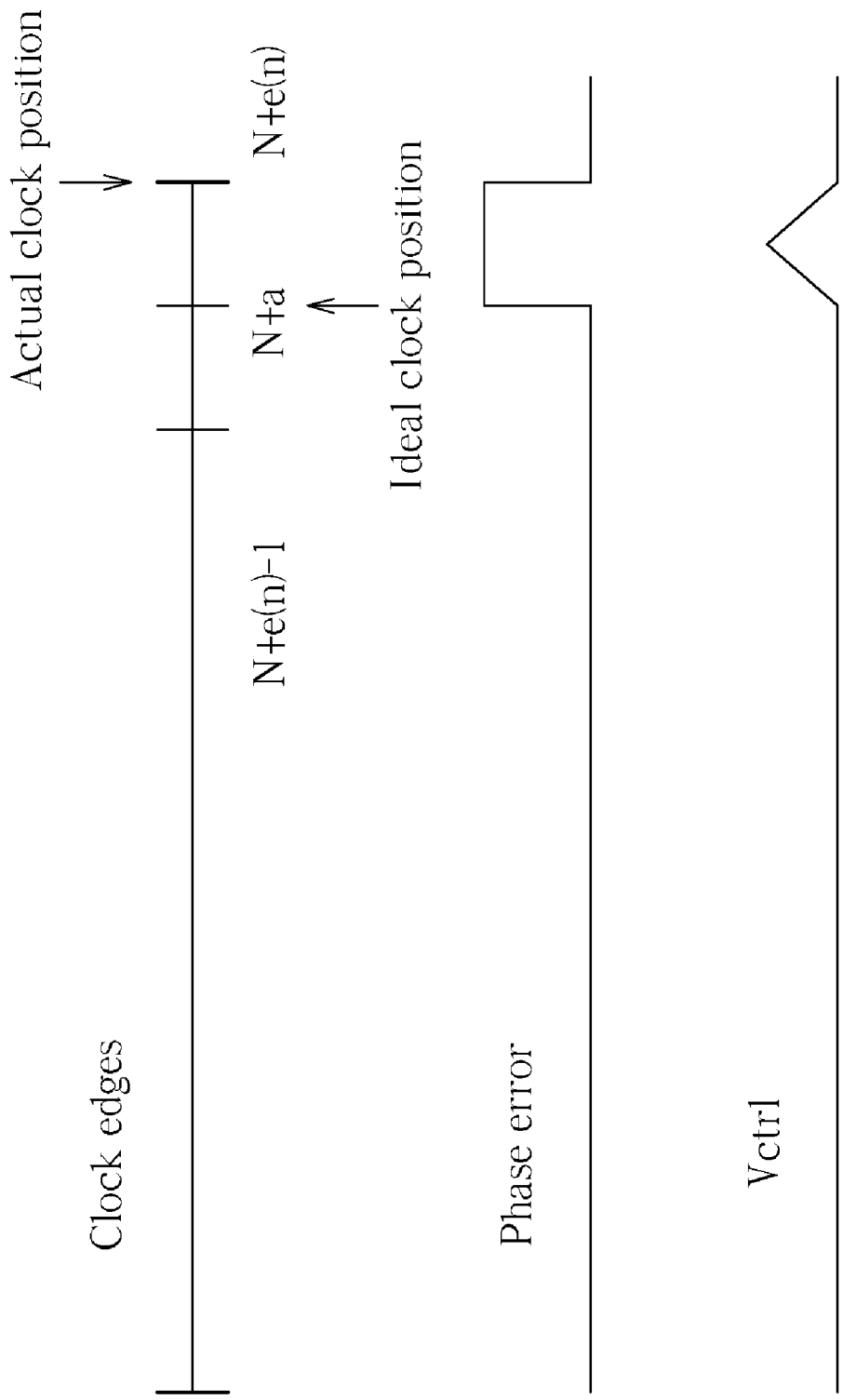
FIG. 9 is a simplified diagram in explaining how conventional fractional phase errors of a conventional analog PLL are compensated.

In FIG. 1, the error compensation signal Error is generated from the SDM compensation module 114 for compensating possible errors from the TDC module 102 and the TDC decoder 1022. The error compensation signal is primarily based on fractional phase errors. Please refer to FIG. 9, which is a simplified diagram in explaining how conventional fractional phase errors of a conventional analog PLL are compensated. In FIG. 9, folded edges indicate clock edges, and a fractional phase error may be indicated as a difference between an actual clock position N+e(n), which is generated from a SDM, and an ideal clock position N+aa, where e(n) is an integer, and aa is a fractional number. Therefore, a corresponding fractional phase error phase_error generated from a phase frequency detector (PFD) may be represented as:

$$\text{phase\_error} = [N+e(n)-(N+aa)] \cdot T_{VCO} = [e(n)-aa] \cdot T_{VCO} \qquad (15)$$

The term $T_{VCO}$ indicates a period of a VCO since the equation (15) is inducted according to an analog PLL and roughly equals $$\frac{1}{Fref \cdot (N+a)}.$$

An accumulated compensation error compensation_error may thus be derived by accumulating the corresponding fractional phase error phase_error and be derived as:

$$\text{compensation\_error} = \Sigma[e(n)-aa] \cdot T_{VCO} \qquad (16)$$

By using a TDC, the compensation error may be quantized as follows:

$$\text{compensation\_error} = \Sigma[e(n)-aa] \cdot T_{VCO}/TDC \approx \Sigma[e(n)-aa]/[TDC \cdot Fref \cdot (N+a)] \qquad (17)$$

Figure 10:
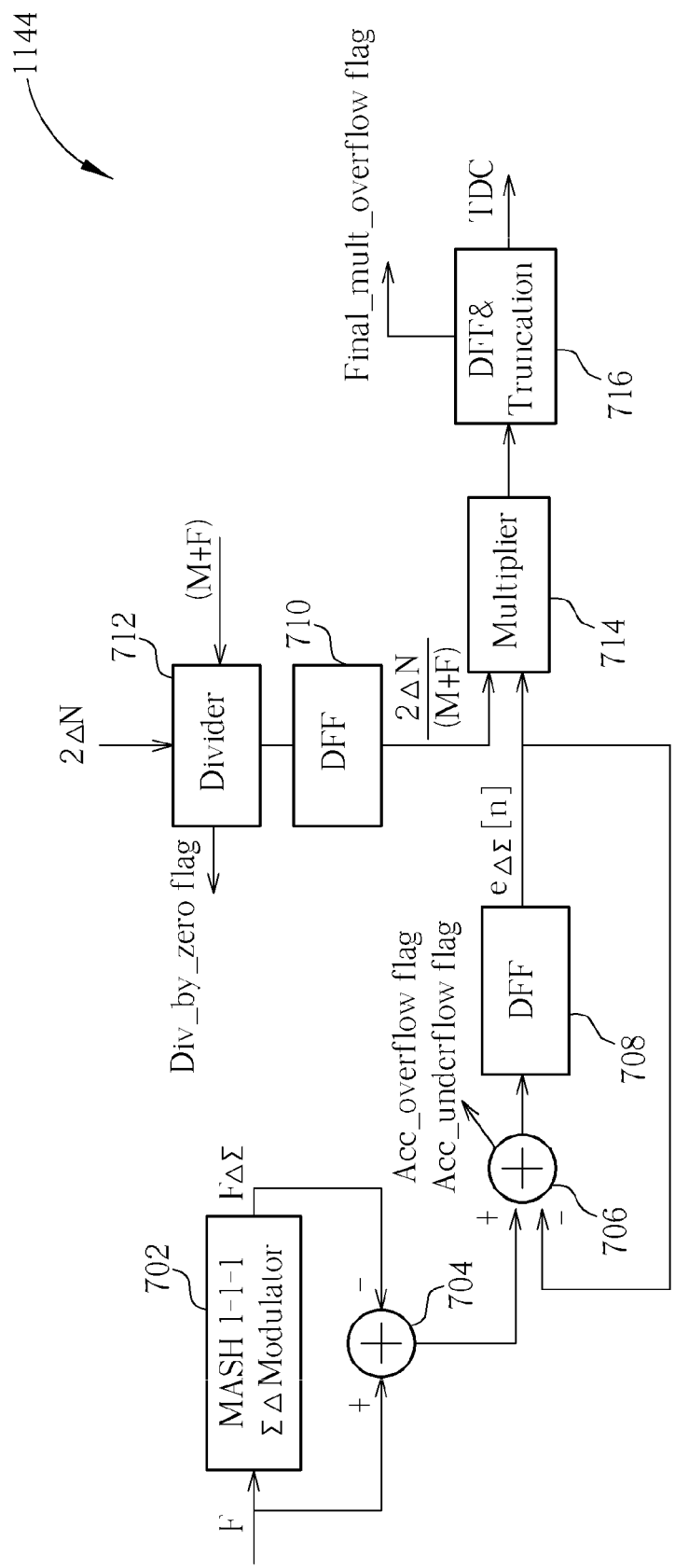
FIG. 10 is a diagram of a digital phase error cancellation module further included in the SDM compensation module shown in FIG. 1 according to a preferred embodiment of the present invention.

However, using a TDC may cause a code variance, for example, $N_1$, as well as a large number of delay lines in the TDC, and take large circuit area and power also. Therefore, a cyclic TDC is proposed in the present invention and disposed within the PFD/CTDC module 1021 for significantly saving many taps of delay lines. The disclosure of the CTDC will be described later. Moreover, in the ADPLL 100 of the present invention, a DCO 1104 is used for replacing the conventional VCO. The difference between the actual clock position N+e (n) and the ideal clock position N+aa may be derived with the aid of the SDM 1121 so that the difference may be denoted as $e_{\Delta\Sigma}$, which is in fact a quantization error. According to an error compensation algorithm used in the present invention, the compensation error $e_{CTDC}[k]$ of the cyclic TDC within the PDF/CTDC module 1021 may be indicated as:

$$e_{CTDC}[k] = \sum_{n=0}^{k-1} e_{\Delta\Sigma} \cdot \frac{T_{DCO}}{TDC} \tag{18}$$

$$= \sum_{n=0}^{k-1} e_{\Delta\Sigma} \cdot \frac{1}{TDC \cdot Fref \cdot (M+F)}$$

$$= \sum_{n=0}^{k-1} e_{\Delta\Sigma} \cdot \frac{\Delta N}{\Delta t \cdot Fref \cdot (M+F)}$$

$$= \sum_{n=0}^{k-1} e_{\Delta\Sigma} \cdot \frac{2 Fref \cdot \Delta N}{Fref \cdot (M+F)}$$

$$= \sum_{n=0}^{k-1} e_{\Delta\Sigma} \cdot \frac{2 \cdot \Delta N}{(M+F)}$$

where the term I occupies the same definition as N. $T_{DCO}$ is a period of the DCO 1104. As can be observed from the equation (18), the compensation error $e_{CTDC}[k]$ of the cyclic TDC may be completely controllable and digital so as to be used in the digital phase error cancellation. Please refer to FIG. 10, which is a diagram of a digital phase error cancellation module 1144 further included in the SDM compensation module 114 according to a preferred embodiment of the present invention. The digital phase error cancellation module 1144 is based on the equation (18). The digital phase error cancellation module 1144 includes a SDM 702, a first adder 704, a second adder 706, a first D flip-flop (DFF) 708, a second D flip-flop 710, a divider 712, a multiplier 714, and a DFF/Truncation module 716. The SDM 702 is implemented with a multi stage noise shaping (MASH) 1-1-1 modulator having first order modulators. An obvious benefit in using a MASH n-1-1 modulator having an n-th order modulator and all other first order modulators lies in the fact that coefficient mismatches are less since most noises are easily cancelled inside. The SDM 702, the first adder 704, the second adder 706, and the first DFF 708 are utilized for generating the quantization error $e_{\Delta\Sigma}$. The second DFF 710 and the second divider 712 are utilized for generating the term $$\frac{2 \cdot \Delta N}{(I+F)}.$$

The compensation error $e_{CTDC}[k]$ is outputted to the first adder 104 at last.

A specific technique of the present invention is also used in the TDC decoder 1022. In this technique, an error protection code is further added into the output signal TDC of the TDC decoder 1022 for raising precision of the output signal TDC. Assume inputs of the TDC decoder 1022 include a digital code $D[0:2^m-1]$ having $2^m$ bits, and a cycle code $C[0:(m-1)]$ having m bits, where m is a positive integer. In a preferred embodiment of the present invention, the value of the positive integer m is 5 so that the cycle code C has 5 bits, and so that the digital code D has 32 bits. In a simplest way, an error protection code err_protect is generated by performing an exclusive-or operation on a last bit of the digital code D and a first bit of the cycle code C. Therefore, the error protection code err_protect may be represented as:

$$\text{err\_protect} = XOR(D[2^m-1], C[0]) \tag{19}$$

In a preferred embodiment of the present invention, an output signal $TDC[0:2(m-1)+1]$ of the TDC decoder 1022 having 10 bits may also be indicated as:

$$TDC[0:2\cdot(m-1)+1] = (C[0:(m-1)] + \text{err\_protect}) * 2^m + \text{output1}[0:(m-1)] \tag{20}$$

Note that the term output1 indicates a decoding signal of the TDC decoder 1022 for indicating how many bits 0 or bits 1 in the digital code D. By adding the error protection code (or bit) into the cycle code C, and by raising the cycle code C by m bits (since the multiplier is $2^m$), the precision of the output signal TDC of the TDC decoder 1022 is significantly raised.

Figure 11:
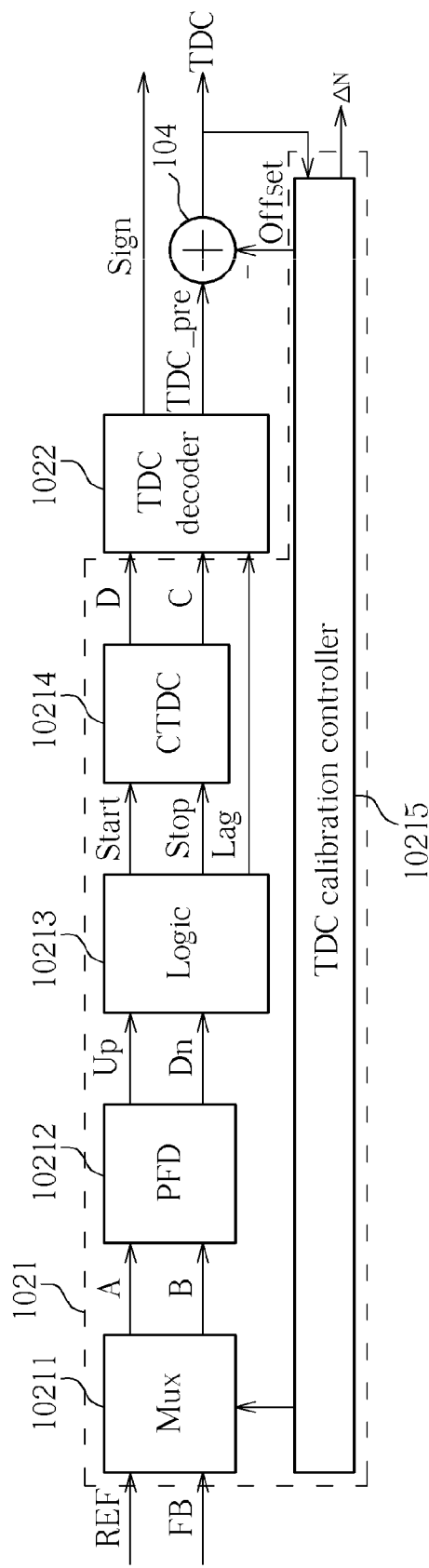
FIG. 11 illustrates a simplified diagram of the PFD/CTDC module shown in FIG. 1 along with the TDC decoder and the first adder shown in FIG. 1 while the loop gain calibration described in FIG. 8 is performed.
Figure 12:
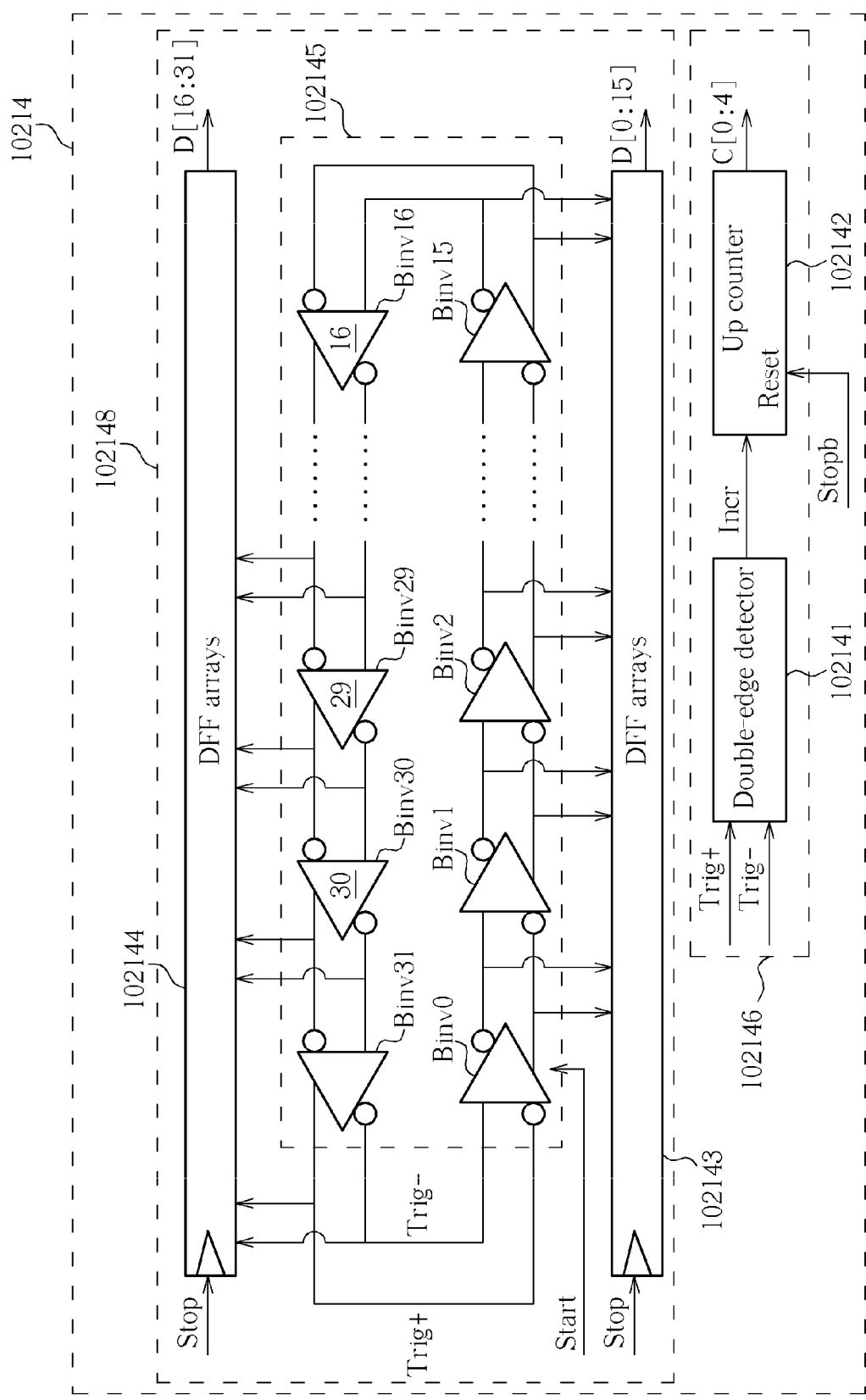
FIG. 12 illustrates a schematic diagram of a cyclic time-to-digital converter (CTDC) used in FIG. 11.
Figure 13:
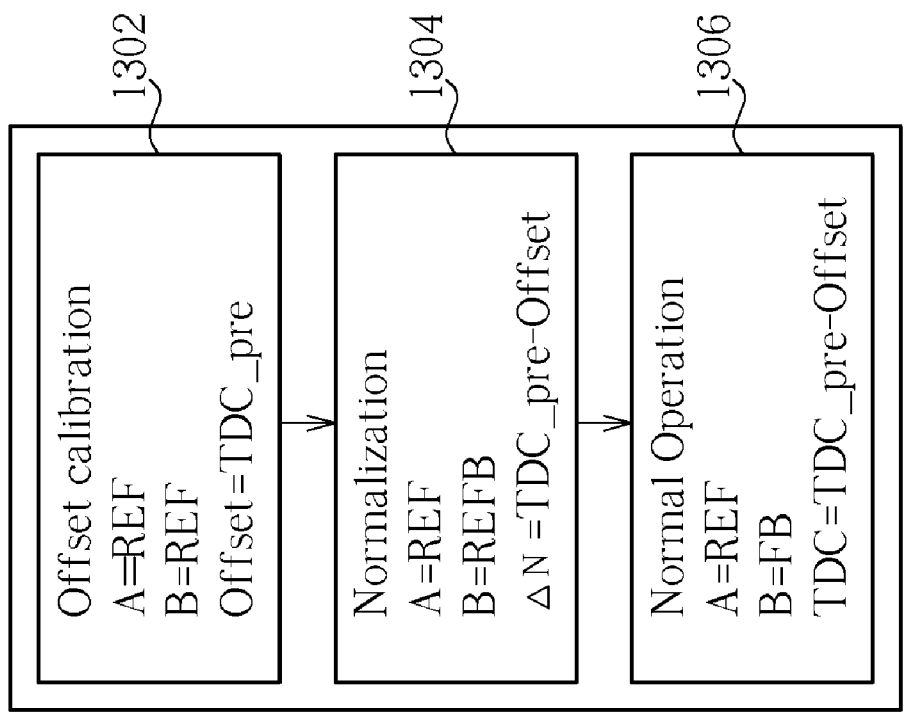
FIG. 13 illustrates a CTDC calibration procedure related to both FIG. 11 and FIG. 12.

Please refer to FIG. 11, FIG. 12, and FIG. 13. FIG. 11 illustrates a simplified diagram of the PFD/CTDC module 1021 shown in FIG. 1 along with the TDC decoder 1022 and the first adder 104 shown in FIG. 1 while the loop gain calibration described in FIG. 8 is performed. FIG. 12 illustrates a schematic diagram of a cyclic time-to-digital converter (CTDC) used in FIG. 11. FIG. 13 illustrates a CTDC calibration procedure related to both FIG. 11 and FIG. 12.

As shown in FIG. 11, the PFD/CTDC module 1021 includes a multiplexer 10211, a phase-frequency detector (PFD) 10212, a logic unit 10213, a CTDC 10214, and a TDC calibration controller 10215. The multiplexer 10211 is utilized for receiving the reference signal REF and the feedback signal FB shown in FIG. 1. The PFD 10212 receives two output signals A and B from the multiplexer 10211, where both the output signals A and B correspond to the reference signal REF or the feedback signal FB. The PFD 10212 also outputs a frequency-raising signal Up and a frequency-lowering signal Dn for raising or lowering a frequency of the output signal TDC of the TDC decoder 1022, as described in FIG. 1. The logic unit 10213 receives both the frequency-raising signal Up and the frequency-lowering signal Dn, and issues an activating signal Start or a deactivating signal Stop for activating or deactivating the CTDC 10214 at any time. The logic unit 10213 also outputs the sign signal Lag to the TDC decoder 1022. The CTDC 10214 generates the data signal D corresponding to D flip-flops within and the cycle signal C corresponding to a utilized cycle within. The TDC calibration controller 10215 generates a calculated offset signal Offset according to the output signal TDC, and generates the code variance $\Delta N$.

As shown in FIG. 12, the CTDC 10214 includes a cycle module 102146 and a data module 102148. The cycle module 102146 includes a double-edge detector 102141 and an N-bit up counter 102142, and generates the cycle signal C of the PFD/TDC module 102. The data module 102148 includes a first D flip-flop array set 102143, a second D flip-flop array set 102144, and a cyclic buffer array 102145, and generates the data signal D of the PFD/TDC module 102. The double-edge detector 102141 receives triggering signals Trig+ and Trig- within the data module 102148 for detecting a rising edge or a falling edge. Whenever the double-edge detector 102141 receives the triggering signal Trig+ or the triggering signal Trig− from the data module 102148, a count of the N-bit up-counter 102142 is incremented. Each time when the count of the N-bit up-counter 102142 exceeds a predetermined number, a new cycle is initiated in the N-bit up-counter 102142 begins whereas an old cycle ends. At this time, a number for recording a current cycle of the N-bit up-counter 102142 is outputted in the form of the cycle signal C. In a preferred embodiment of the present invention, a number of bits within the cycle signal C is 5. The first D flip-flopfilp flop array 102143, the second D flip-flop array 102144, and the cyclic buffer array 102145 together forms a cyclic structure. Note that the cyclic buffer array 102145 includes a plurality of delay line buffers Binv connected in series, and an input terminal of a first delay line buffer within the plurality of delay line buffers Binv is coupled to an output terminal of a last delay line buffer within the plurality of delay line buffers Binv. In a preferred embodiment of the present invention, a number of the plurality of delay line buffers Binv is 32, i.e. the delay line buffers Binv0, Binv1, Binv2, . . . , Binv30, and Binv31 illustrated in FIG.12; and the plurality of delay line buffers Binv is implemented with inverters or other logic units appropriate for implementing delay line taps. The first D flip-flop array 102143 cooperates with a front half of the plurality of delay line buffers Binv, and the second D flip-flop array 102144 cooperates with a rear half of the plurality of delay line buffers Binv. When the number of the plurality of delay line buffers Binv is 32, the first D flip-flop array 102143 outputs a first half of the data signal D with 16 bits, whereas the second D flip-flop array 102144 outputs a second half of the data signal with 16 bits.

As shown in FIG. 13, a calibration procedure of the CTDC 10214 for calibrating the loop gain of the ADPLL 100 or 200 is described.

In Step 1302, an offset calibration is performed by assigning input signals A and B with the reference signal REF respectively by directly manipulating the multiplexer 10211. Moreover, an offset signal Offset from the TDC calibration controller 10215 is also assigned as a predict signal TDC_pre from the TDC decoder 1022. Note that the predict signal TDC_pre includes information of the feedback signal FB so that a predicted error in the signal TDC may be compensated in advance with the aid of the first adder 104. At this time, the signal TDC should be logic 0, and the offset calibration is completed.

In Step 1304, a normalization procedure is performed by keeping the input signal A as the reference signal REF and re-assigning the input signal B as an inverse REFB of the reference signal REF, i.e. padding a bar for indicating the inverse of the reference signal REFB. At this time, the above-mentioned fractional code variance ΔN is generated from the TDC calibration controller 10215 in a form of a TDC predict offset signal TDC_pre-Offset for performing the normalization of the ADPLL 100 or 200 during the loop gain calibration.

In Step 1306, a normal operation is performed while the ADPLL 100 or 200 is also under normal operations. At this time, the input signal A is still kept as the reference signal REF, and the input signal B is re-assigned as the feedback signal FB for measuring properties of a newly outputted signal from the DCO/SDM module 110 in a next delay.

With the aid of the ADPLL and other related components including the above-disclosed DCO or methods disclosed in the present invention, defects in a conventional analog phase-locked loop may be completely removed since all components and operations in the disclosed ADPLL are digital.

Moreover, with the aid of the above-disclosed DCO, fine frequency resolution is achieved in the disclosed ADPLL, and related frequency discontinuities are eliminated as well.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An error compensation method for an ADPLL (All-digital phase-locked loop), comprising:
   determining a quantization error to generate a determined quantization error;
   determining a fractional error corresponding to a gain of a time-to-digital converter (TDC) within the ADPLL to generate a determined fractional error;
   determining a compensation error according to:

$$e_{CTDC}[k] = \sum_{n=0}^{k-1} e_{\Delta\Sigma}[n] \cdot \frac{2 \cdot \Delta N}{(M+F)};$$

and using the determined compensation error to compensate an error within the ADPLL;
   wherein $e_{\Delta\Sigma}[n]$ indicates the quantization error; ΔN indicates the determined fractional error; M indicates a dividing ratio of a frequency divider; and F indicates a fractional number related to the quantization error.

2. The error compensation method of claim 1 wherein adding the determined compensation error to compensate the error within the ADPLL comprises:
   adding the determined compensation error to an output of a TDC module having the TDC to compensate the error within the ADPLL.

3. The error compensation method of claim 1 further comprising:
   utilizing a feedback module having the frequency divider to generate the dividing ratio; and
   utilizing a digital macro module having a digital low-pass filter to generate the fractional error.

4. An error compensation method for an ADPLL (All-digital phase-locked loop) comprising:
   determining a quantization error;
   determining a gain of a time-to-digital converter (TDC);
   determining a period of a digital-controlled oscillator (DCO);
   determining a compensation error according to the quantization error, the gain of the TDC, the period of the DCO or a combination thereof; and
   utilizing a sum of the determined compensation error and an output of a TDC module comprising the TDC when compensating for an error within the ADPLL;
   wherein determining the compensation error according to the quantization error, the gain of the TDC, the period of the DCO or a combination thereof comprises:
   determining the compensation error according to:

$$e_{CTDC}[k] = \sum_{n=0}^{k-1} e_{\Delta\Sigma}[n] \cdot \frac{T_{DCO}}{TDC};$$

wherein $e_{CTDC}[k]$ indicates the compensation error; $e_{\Delta\Sigma}[n]$ indicates the quantization error; $T_{DCO}$ indicates a period of the DCO; $TDC_{13}$ indicates the gain of the TDC.

5. An error compensation method for an ADPLL (All-digital phase-locked loop) comprising:
  determining a quantization error;
  determining a gain of a time-to-digital converter (TDC);
  determining a period of a digital-controlled oscillator (DCO);
  determining a compensation error according to the quantization error, the gain of the TDC, the period of the DCO or a combination thereof; and
  utilizing a sum of the determined compensation error and an output of a TDC module comprising the TDC when compensating for an error within the ADPLL;
  wherein determining the gain of the TDC comprises:
  determining the gain of the TDC according to:

$$TDC = \frac{\frac{1}{2}Tref}{\Delta N} = \frac{1}{2Fref \cdot \Delta N}$$

wherein TDC indicates the gain of the TDC; Tref indicates a reference period of a reference signal received by the TDC module, Fref indicates a reference frequency of the reference signal, and $\Delta N$ indicates a code variance corresponding to a half of the reference period Tref.

6. An error compensation method for an ADPLL (All-digital phase-locked loop) comprising:
  determining a quantization error;
  determining a gain of a time-to-digital converter (TDC);
  determining a period of a digital-controlled oscillator (DCO);
  determining a compensation error according to the quantization error, the gain of the TDC, the period of the DCO or a combination thereof; and
  utilizing a sum of the determined compensation error and an output of a TDC module comprising the TDC when compensating for an error within the ADPLL;
  wherein determining the period of the DCO comprises:
  determining the period of the DCO according to:

$$T_{DCO} = \frac{1}{Fref \cdot (M+F)};$$

wherein $T_{DCO}$ indicates the period of the DCO; Fref indicates a reference frequency of a reference signal received by the TDC module; M indicates the dividing ratio of frequency divider; and F indicates a fractional number related to the quantization error.

7. An error compensation method for an ADPLL (All-digital phase-locked loop) comprising:
  determining a quantization error;
  determining a gain of a time-to-digital converter (TDC);
  determining a period of a digital-controlled oscillator (DCO);
  determining a compensation error according to the quantization error, the gain of the TDC, the period of the DCO or a combination thereof; and
  utilizing a sum of the determined compensation error and an output of a TDC module comprising the TDC when compensating for an error within the ADPLL;
  wherein determining the gain of the TDC comprises determining the gain of the TDC according to:

$$TDC = \frac{\frac{1}{2}Tref}{\Delta N} = \frac{1}{2Fref \cdot \Delta N}$$

wherein TDC indicates the gain of the TDC; Tref indicates a reference period of a reference signal received by the TDC module, Fref indicates a reference frequency of the reference signal, and $\Delta N$ indicates to a code variance corresponding to a half of the reference period Tref;
  wherein determining the period of the DCO comprises determining the period of the DCO according to:

$$T_{DCO} = \frac{1}{Fref \cdot (M+F)};$$

wherein $T_{DCO}$ indicates the period of the DCO; M indicates a dividing ratio of a frequency divider; and F indicates a fractional number related to the quantization error.

8. The error compensation method of claim 7 wherein determining the compensation error according to the quantization error, the gain of the TDC, the period of the DCO or a combination thereof comprises:
  determining the compensation error according to:

$$e_{CTDC}[k] = \sum_{n=0}^{k-1} e_{\Delta\Sigma}[n] \cdot \frac{2 \cdot \Delta N}{(M+F)}$$

wherein $e_{\Delta\Sigma}[n]$ indicates the quantization error.

9. A digital phase error cancellation module for compensating an error of an ADPLL (All-digital phase-locked loop) comprising:
  a sigma-delta modulator (SDM);
  a first adder having a positive input terminal coupled to an input terminal of the SDM and having a negative input terminal coupled to an output terminal of the SDM;
  a second adder having a positive terminal coupled to an output terminal of the first adder; and
  a first D flip-flop having an input terminal coupled to an output terminal of the second adder and having an output terminal coupled to a negative input terminal of the second adder;
  wherein the digital phase error cancellation module is disposed inside the ADPLL.

10. The digital phase error cancellation module of claim 9 further comprising:
  a multiplier having a first input terminal coupled to an output terminal of the first D flip-flop;
  a divider;
  a second D flip-flop having an input terminal coupled to an output terminal of the divider and having an output terminal coupled to a second input terminal of the multiplier; and
  a DFF/Truncation module having an input terminal coupled to an output terminal of the multiplier.

11. The digital phase error cancellation module of claim 10 wherein a term indicating a period of a digital controlled oscillator (DCO) over a gain of a time-to-digital converter (TDC) of the ADPLL is generated by both the divider and the second D flip-flop.

12. The digital phase error cancellation module of claim 11 wherein the term indicating the period of the DCO over the gain of the TDC of the ADPLL is transformed into $$\frac{2 \cdot \Delta N}{(M+F)};$$

wherein ΔN indicates to a code variance corresponding to a half of a reference period received by a TDC module of the ADPLL having the TDC; M indicates the dividing ratio of the frequency divider; and F indicates the fractional number related to the quantization error outputted at the output terminal of the first D flip-flop.

13. The digital phase error cancellation module of claim 10 wherein a quantization error is generated by the SDM, the first adder, the second adder, and the first D flip-flop, and is outputted at an output terminal of the first D flip-flop; wherein a term indicating a period of a digital controlled oscillator (DCO) over a gain of a time-to-digital converter (TDC) of the ADPLL is generated by both the divider and the second D flip-flop.

14. The digital phase error cancellation module of claim 13, wherein the term indicating the period of the DCO over the gain of the TDC of the ADPLL is transformed into $$\frac{2 \cdot \Delta N}{(M+F)};$$

wherein ΔN indicates to a code variance corresponding to a half of a reference period received by a TDC module of the ADPLL having the TDC; M indicates the dividing ratio of the frequency divider; F indicates the fractional number related to the generated quantization error; wherein a compensation error is generated from the digital phase error cancellation module in a form of:

$$e_{CTDC}[k] = \sum_{n=0}^{k-1} e_{\Delta\Sigma}[n] \cdot \frac{2 \cdot \Delta N}{(M+F)}$$

wherein $e_{\Delta\Sigma}[n]$ indicates the quantization error.

15. The digital phase error cancellation module of claim 9 wherein a quantization error is generated by the SDM, the first adder, the second adder, and the first D flip-flop, and is outputted at an output terminal of the first D flip-flop.

16. The digital phase error cancellation module of claim 9 wherein the SDM is implemented with a multi stage noise shaping (MASH) 1-1-1 modulator.

17. An ADPLL (All-digital phase-locked loop) with error compensation comprising:
a digital macro module comprising:
  a sigma-delta modulator (SDM) compensation module comprising:
    a digital phase error cancellation module comprising:
      a sigma-delta modulator (SDM);
      a first adder having a positive input terminal coupled to an input terminal of the SDM and having a negative input terminal coupled to an output terminal of the SDM;
      a second adder having a positive terminal coupled to an output terminal of the first adder; and
      a first D flip-flop having an input terminal coupled to an output terminal of the second adder and having an output terminal coupled to a negative input terminal of the second adder.

18. The ADPLL of claim 17 further comprising:
a multiplier having a first input terminal coupled to an output terminal of the first D flip-flop;
a divider;
a second D flip-flop having an input terminal coupled to an output terminal of the divider and having an output terminal coupled to a second input terminal of the multiplier; and
a DFF/Truncation module having an input terminal coupled to an output terminal of the multiplier.

19. The ADPLL of claim 18 wherein a quantization error is generated by the SDM, the first adder, the second adder, and the first D flip-flop, and is outputted at an output terminal of the first D flip-flop; wherein a term indicating a period of a digital controlled oscillator (DCO) over a gain of a time-to-digital converter (TDC) of the ADPLL is generated by both the divider and the second D flip-flop.

20. The ADPLL of claim 19 wherein the term indicating the period of the DCO over the gain of the TDC of the ADPLL is transformed into $$\frac{2 \cdot \Delta N}{(M+F)};$$

wherein ΔN indicates to a code variance corresponding to a half of a reference period received by a TDC module of the ADPLL having the TDC; M indicates the dividing ratio of the frequency divider; F indicates the fractional number related to the generated quantization error; wherein a compensation error is generated from the digital phase error cancellation module in a form of:

$$e_{CTDC}[k] = \sum_{n=0}^{k-1} e_{\Delta\Sigma}[n] \cdot \frac{2 \cdot \Delta N}{(M+F)}$$

wherein $e_{\Delta\Sigma}[n]$ indicates the quantization error.

21. The ADPLL of claim 19 further comprising:
a digital loop filter comprising a proportional path module for tracking variation of phase related to an outputted signal from a time-to-digital converter (TDC) module having the TDC; and
a digital-controlled oscillator (DCO) module having the DCO and for tracking an integer signal from the digital loop filter;
wherein the TDC module receives a feedback signal corresponding to an outputted signal from the DCO module, the TDC module further comprises:
a phase-frequency detector (PFD) for receiving two input signals corresponding to a reference signal or the feedback signal, and for outputting a frequency-raising signal and a frequency-lowering signal; and
a logic unit for receiving the frequency-raising signal and the frequency-lowering signal and for issuing an activating signal or a deactivating signal;
wherein the TDC is for receiving the activating signal or the deactivating signal and for generating a cycle signal and a data signal.

22. The ADPLL of claim 21 further comprises:
a TDC decoder receiving both the cycle signal and the data signal and generating a predict signal; and an adder generating an output signal to the digital loop filter according to the predict signal from the TDC decoder and an offset signal from the TDC calibration controller;

wherein the frequency-raising signal is used for raising a frequency of the output signal of the adder, the frequency-lowering signal is used for lowering the frequency of the output signal of the adder, the activating signal is used for activating the TDC, and the deactivating signal is used for deactivating the TDC;

wherein a digital code is retrieved from the TDC decoder, an exclusive-or operation is performed on a first predetermined bit of the digital code and a second predetermined bit of the cycle signal for generating an error protection code, and the error protection code is used to fix errors within the cycle signal by adding the error protection code into the cycle signal and shifting the cycle signal by a third predetermined number of bits.

23. The ADPLL of claim 21 wherein the SDM is implemented with a multi stage noise shaping (MASH) 1-1-1 modulator.

* * * * *